United States Patent
Inagaki et al.

(10) Patent No.: US 12,108,570 B2
(45) Date of Patent: Oct. 1, 2024

(54) VAPOR CHAMBER

(71) Applicant: Furukawa Electric Co., Ltd., Tokyo (JP)

(72) Inventors: Yoshikatsu Inagaki, Tokyo (JP);
Kenya Kawabata, Tokyo (JP);
Hirofumi Aoki, Tokyo (JP)

(73) Assignee: Furukawa Electric Co., Ltd., Tokyo (JP)

( * ) Notice: Subject to any disclaimer, the term of this patent is extended or adjusted under 35 U.S.C. 154(b) by 354 days.

(21) Appl. No.: 17/508,736

(22) Filed: Oct. 22, 2021

(65) Prior Publication Data

US 2022/0046825 A1 Feb. 10, 2022

Related U.S. Application Data

(63) Continuation of application No. PCT/JP2020/041220, filed on Nov. 4, 2020.

(30) Foreign Application Priority Data

Nov. 6, 2019 (JP) .................................. 2019-201833
Nov. 21, 2019 (JP) ................................. 2019-210505

(51) Int. Cl.
*H05K 7/20* (2006.01)
*F28D 15/02* (2006.01)
*F28D 15/04* (2006.01)

(52) U.S. Cl.
CPC ..... *H05K 7/20336* (2013.01); *F28D 15/0233* (2013.01); *F28D 15/046* (2013.01)

(58) Field of Classification Search
CPC ............ H05K 7/20336; F28D 15/0233; F28D 15/046

(Continued)

(56) References Cited

U.S. PATENT DOCUMENTS

| 11,765,861 B2* | 9/2023 | Yang .................... H01L 23/3736 |
| | | 165/104.26 |
| 11,817,371 B2* | 11/2023 | Jarrett ...................... F28F 3/022 |
| 11,871,541 B2* | 1/2024 | Moon ....................... G06F 1/203 |
| 2009/0040726 A1* | 2/2009 | Hoffman ............. F28D 15/0233 |
| | | 29/890.032 |

(Continued)

FOREIGN PATENT DOCUMENTS

| CN | 107367183 A | 11/2017 |
| JP | 2003322483 A | 11/2003 |

(Continued)

OTHER PUBLICATIONS

[English Translation] Notice of Reasons for Refusal (1st OA) for Japanese Patent Application No. 2019-210505, dated Jun. 23, 2020.

(Continued)

*Primary Examiner* — Joel M Attey
(74) *Attorney, Agent, or Firm* — Dorsey & Whitney LLP

(57) ABSTRACT

The vapor chamber includes a container having a cavity formed of one plate-shaped body to which a heating element is thermally connected and another plate-shaped body facing the one plate-shaped body, a working fluid enclosed in the cavity, and a wick structure that is enclosed in the cavity and separated from the container. The container includes a support part protruding from an inner surface of the other plate-shaped body toward the one plate-shaped body, the support part being formed of a recessed part provided to an outer surface of the other plate-shaped body. At the rising base portion of the support part from the inner surface of the other plate-shaped body, the defined angle between the support part and the inner surface of the other plate-shaped body is an obtuse angle.

13 Claims, 6 Drawing Sheets

(58) Field of Classification Search
USPC .................................................. 165/104.26
See application file for complete search history.

(56) References Cited

U.S. PATENT DOCUMENTS

| | | | |
|---|---|---|---|
| 2017/0010048 A1* | 1/2017 | Wang ...................... B23P 15/26 |
| 2017/0138673 A1 | 5/2017 | Aoki et al. |
| 2017/0328647 A1 | 11/2017 | Aston et al. |
| 2018/0010861 A1 | 1/2018 | Wakaoka et al. |
| 2019/0271510 A1* | 9/2019 | Yang .................. F28D 15/0275 |
| 2019/0353430 A1* | 11/2019 | Narasimhan ........ F28D 15/0266 |
| 2020/0049421 A1 | 2/2020 | Wakaoka et al. |
| 2020/0098665 A1* | 3/2020 | Jarrett ..................... F28F 3/044 |
| 2023/0417491 A1* | 12/2023 | Wang .................... F28D 15/046 |

FOREIGN PATENT DOCUMENTS

| | | |
|---|---|---|
| JP | 2008118357 A | 5/2008 |
| JP | 2008241227 A | 10/2008 |
| JP | 2011017463 A | 1/2011 |
| JP | 2016035348 A | 3/2016 |
| JP | 2018189349 A | 11/2018 |
| JP | 2019143960 A | 8/2019 |
| WO | 2016151916 A1 | 9/2016 |
| WO | 2018199216 A1 | 11/2018 |

OTHER PUBLICATIONS

[English Translation] Notice of Reasons for Refusal (2nd OA) for Japanese Patent Application No. 2019-210505, dated Nov. 18, 2020.
International Search Report and Written Opnion (English Translation only for ISR) for PCT Application No. PCT/JP2020/041220, mailed Dec. 8, 2020.
[English Translation] Written Opinion for International Patent Application No. PCT/JP2020/041220 mailed Dec. 8, 2020, pp. all.
International Preliminary Report on Patentability for International Patent Application No. PCT/JP2020/041220, dated Oct. 5, 2022, pp. all.

* cited by examiner

VAPOR CHAMBER

CROSS REFERENCE TO RELATED APPLICATIONS

The present application is a continuation application of International Patent Application No. PCT/JP2020/041220 filed on Nov. 4, 2020, which claims the benefit of Japanese Patent Application No. 2019-201833, filed on Nov. 6, 2019 and Japanese Patent Application No. 2019-210505, filed on Nov. 21, 2019. The contents of these applications are incorporated herein by reference in their entirety.

BACKGROUND

Technical Field

The present disclosure relates to a vapor chamber having excellent resistance to pressure from the external environment and excellent heat dissipation property, and allowing the flow property of the working fluid to be smoothed.

Background

In electronic components such as semiconductor elements mounted on electric and electronic devices, since the amount of heat generation increases due to high-density mounting and the like associated with high functionality, cooling of the electronic components has become more important recently. Meanwhile, due to size reduction of an electronic device, a heating element of an electronic component or the like may be disposed in a narrow space. As a cooling method of a heating element of an electronic component or the like mounted in a narrow space, a vapor chamber (planar heat pipe) may be used. Moreover, from the viewpoint of size reduction and weight reduction of a vapor chamber, it is desired to reduce the thickness of the container of a vapor chamber.

Since the inside of a container is decompressed, in the case of a container with a reduced thickness, there is a possibility that the container is deformed by an action of the barometric pressure or the load. If the container is deformed, the flow property of a working fluid is lowered, whereby the heat dissipation property of the vapor chamber may be lowered. Therefore, in order to maintain the internal space of the container, a support part may be provided to the inside of the container of the vapor chamber.

As conventional art of providing a support part inside a container, for example, a vapor chamber including a container, a column disposed in the internal space of the container so as to support the container from the inner side, a working fluid enclosed in the internal space of the container, and a wick disposed in the internal space of the container, wherein at least a portion of the main inner surface of the container is exposed to the internal space of the container, has been proposed (Japanese Patent Laid-Open No. 2018489349).

However, in a conventional vapor chamber such as one disclosed in Japanese Patent Laid-Open No. 2018-189349, the support part is in a quadrangular shape in a side view. Accordingly, in a conventional vapor chamber, a defined angle between the rising base portion of the support part from the container and the inner surface of the container is a right angle. When the defined angle is a right angle, at the rising base portion of the support part, that is, a boundary portion between the support part and the inner surface of the container, a working fluid in a liquid phase is likely to remain, whereby there is a possibility that the working fluid in a liquid phase cannot circulate smoothly to the heat receiving surface. Further, since the side surface of the support part exposed to the internal space of the container cannot contribute to the heat dissipation action of the vapor chamber, there is room for improving the heat dissipation property of the vapor chamber.

SUMMARY

The present disclosure is related to providing a vapor chamber having excellent resistance to the pressure from the external environment and excellent heat dissipation property, and allowing the flow property of the working fluid to be smoothed.

A summary of the configuration of the present disclosure is as described below.

[1] A vapor chamber including:
a container having a cavity, the cavity being formed of one plate-shaped body to which a heating element is thermally connected and another plate-shaped body facing the one plate-shaped body;
a working fluid enclosed in the cavity; and
a wick structure housed in the cavity, the wick structure being separated from the container, wherein
the container includes a support part protruding from an inner surface of the other plate-shaped body toward the one plate-shaped body, the support part being formed of a recessed part provided to an outer surface of the other plate-shaped body, and
at a rising base portion of the support part from the inner surface of the other plate-shaped body, a defined angle between the support part and the inner surface of the other plate-shaped body is an obtuse angle.

[2] The vapor chamber according to [1], wherein an area of the support part in an extending direction of the other plate-shaped body decreases as the support part progresses from the rising base portion toward a tip end portion of the support part.

[3] The vapor chamber according to [1] or [2], wherein a side face portion of the support part, exposed to the cavity, has a curved surface.

[4] The vapor chamber according to any one of [1] to [3], wherein a tip end porticos of the support part has a flat portion, and the flat portion contacts the wick structure.

[5] The vapor chamber according to any one of [1] to [4], wherein the defined angle is 91° or larger and 150° or smaller.

[6] The vapor chamber according to any one of [1] to [5], wherein a ratio of an area of the rising base portion to an area of the tip end portion of the support part in the extending direction of the other plate-shaped body is 1.1 or larger and 10 or smaller,

[7] The vapor chamber according to any one of [1] to [6], wherein a plurality of the support parts are provided to the other plate-shaped body, and a given one of the support parts and two others of the support parts adjacent to the given one are arranged in a triangular shape.

[8] The vapor chamber according to any one of [1] to [7], wherein the wick structure is a mesh member made of metal.

[9] The vapor chamber according to any one of [1] to [8], wherein a peripheral portion of the one plate-shaped body and a peripheral portion of the other plate-shaped body are joined together by welding using a fiber laser to form the container.

[10] The vapor chamber according to any one of [1] to [9], wherein thickness of the one plate-shaped body is larger than thickness of the other plate-shaped body.

[11] The vapor chamber according to any one of [1] to [9], wherein thickness of the one plate-shaped body is smaller than thickness of the other plate-shaped body.

[12] The vapor chamber according to any one of [1] to [11], wherein the container includes a bent portion in a thickness direction of the container.

In the aspect described above, in the container, the one plate-shaped body to which a heating element is thermally connected mainly functions as a heat receiving surface, and the other plate-shaped body facing the one plate-shaped body mainly function as a heat dissipation surface.

Note that in the present specification, the "inner surface of the other plate-shaped body" and the "outer surface of the other plate-shaped body" do not include a portion serving as a support part. Accordingly, in the aspect described above, the support part is integrated with the other plate-shaped body. Further, since the support part rises from the inner surface of the other plate-shaped body when viewed from the inside of the container, it is a protruding part protruding in a direction from the inner surface of the other plate-shaped body toward the one plate-shaped body.

Further, in the aspect described above, corresponding to the fact that at the rising base portion of the support part from the inner surface of the other plate-shaped body, a defined angle between the support part and the inner surface of the other plate-shaped body is an obtuse angle, the defined angle between the outer surface of the recessed part provided to the outer surface of the other plate-shaped body and the outer surface of the other plate-shaped body is an acute angle. Note that in the present specification, the "defined angle" means a "defined angle" in a side view that is a thickness direction of the container.

According to an aspect of the present disclosure, at the rising base portion of the support part from the other plate-shaped body, since the defined angle between the support part and the other plate-shaped body is an obtuse angle, it is possible to prevent a working fluid in a liquid phase from remaining in the boundary portion between the support part and a flat portion of the other plate-shaped body. Accordingly, the working fluid in a liquid phase can circulate smoothly from the other plate-shaped body to the one plate-shaped body that is a heat receiving surface of the container. Further, according to an aspect of the present disclosure, since the defined angle between the outer surface of the recessed part provided to the outer surface of the other plate-shaped body and the outer surface of the other plate-shaped body is an acute angle, the gas flows to the recessed part smoothly so that the condensing property of the working fluid in a gas phase is improved, whereby the heat dissipation property of the vapor chamber is improved, According to an aspect of the present disclosure, in the container, the outer surface of the other plate-shaped body is provided with the recessed part so that the support part is formed to protrude from the inner surface of the other plate-shaped body toward the one plate-shaped body. Therefore, the surface area of the outer surface of the heat dissipation surface side of the container is increased, and the heat dissipation property of the vapor chamber is improved. Further, according to an aspect of the present disclosure, since the support part is provided, resistance to the pressure from the external environment can be applied to the container.

According to an aspect of the present disclosure, since the area of the support part in the extending direction of the other plate-shaped body decreases as it progresses from the rising base portion toward the tip end portion, the side face portion of the support part exposed to the cavity can largely contribute to heat dissipation. Therefore, the heat dissipation property of the vapor chamber is further improved.

According to an aspect of the present disclosure, since the side face portion of the support part exposed to the cavity has a curved surface, a working fluid in a liquid phase can circulate more smoothly from the heat dissipation surface to the heat receiving surface of the container through the side face portion of the support part.

According to an aspect of the present disclosure, since the tip end portion of the support part has a flat portion and the flat portion contacts the wick structure, the support part serves as a pressing part to press the wick structure to the inner surface of the one plate-shaped body. Accordingly, since the wick structure is stably fixed on to the inner surface of the one plate-shaped body, a working fluid in a liquid phase can be stably supplied to the heat receiving surface of the container.

According to an aspect of the present disclosure, since the defined angle is 91° or larger and 150° or smaller, it is possible to improve prevention of a working fluid in a liquid phase from remaining in the boundary portion between the support part and the flat portion of the other plate-shaped body, and resistance of the container to the pressure from the external environment, in a balanced manner.

According to an aspect of the present disclosure, since the ratio of the area of the ng base portion of the support part to the area of the tip end portion of the support part is 1.1 or larger and 10 or smaller, it is possible to improve prevention of a working fluid in a liquid phase from remaining in the boundary portion between the support part and the flat portion of the other plate-shaped body, and resistance of the container to the pressure from the external environment, in a balanced manner.

According to an aspect of the present disclosure, since a plurality of support parts are arranged in a triangular shape, the resistance of the container to the pressure from the external environment can be further improved. Further, the number of support parts to be arranged can be reduced without impairing the resistance of the container to the pressure from the external environment.

According to an aspect of the present disclosure, since the one plate-shaped body and the other plate-shaped body are joined together by a fiber laser, it is possible to give excellent sealing property of the container by an improvement in the joining strength between the one plate-shaped body and the other plate-shaped body, and to give excellent mechanical strength to the container by preventing a thermal load on the container at the time of joining the one plate-shaped body and the other plate-shaped body together.

DETAILED DESCRIPTION

Figure 1:
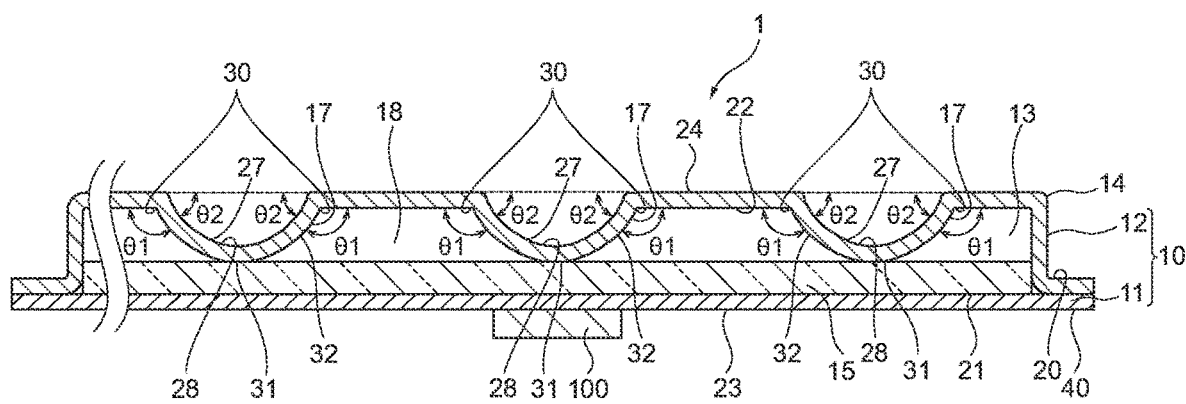
FIG. 1 is a side cross-sectional view of a vapor chamber according to a first exemplary embodiment of the present disclosure.
Figure 2:
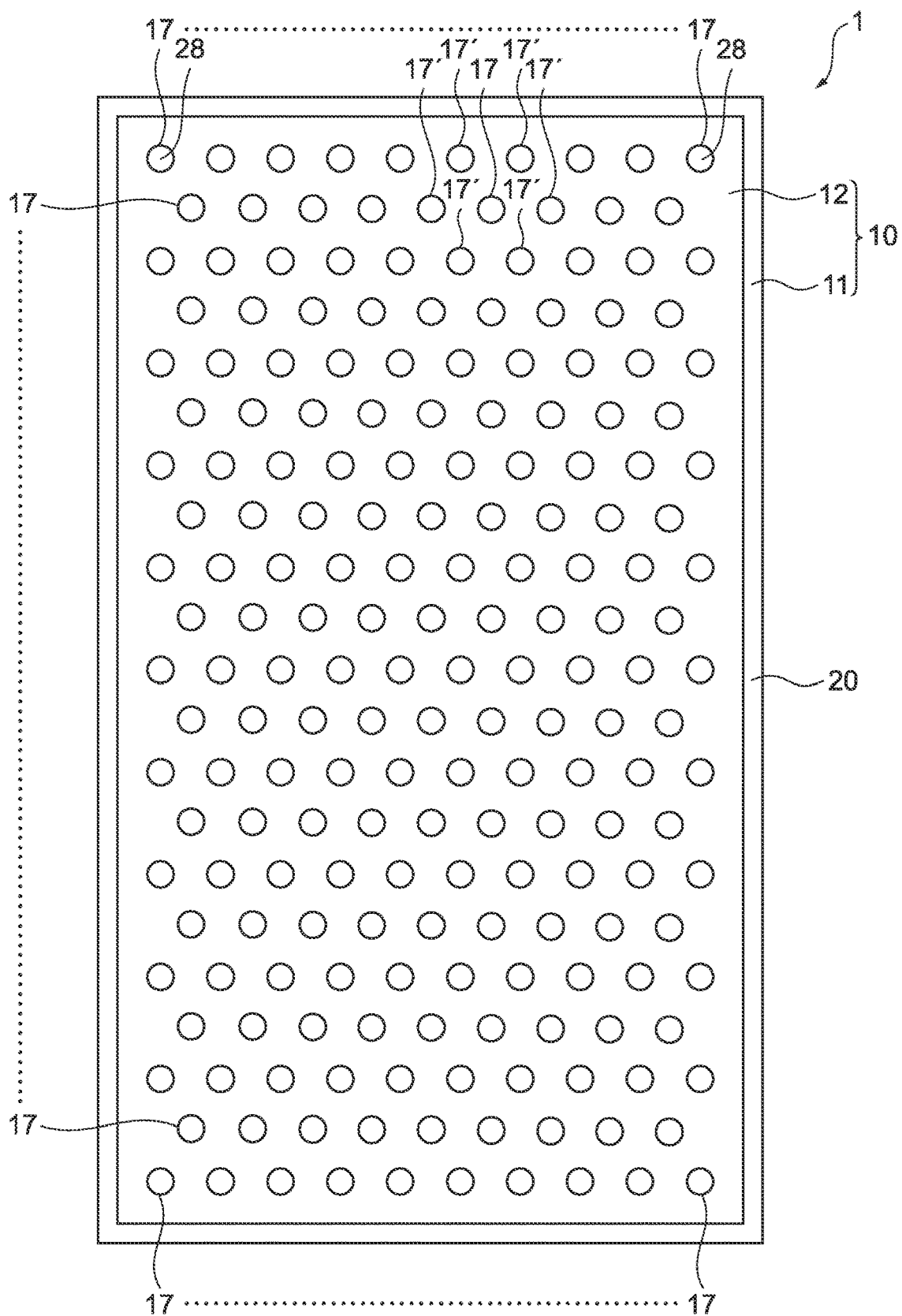
FIG. 2 is a plan view of the vapor chamber according to the first exemplary embodiment of the present disclosure.

Hereinafter, a vapor chamber according to a first exemplary embodiment of the present disclosure will be described with reference to the accompanying drawings. FIG. 1 is a side cross-sectional view of a vapor chamber according to the first exemplary embodiment of the present disclosure. FIG. 2 is a plan view of the vapor chamber according to the first exemplary embodiment of the present disclosure.

As illustrated in FIGS. 1 and 2, a vapor chamber 1 according to the first exemplary embodiment of the present disclosure includes a container 10 of a planar type in a predetermined shape in a plan view (in a state viewed from a vertical direction with respect to a plane of the vapor chamber 1, that is, a direction parallel to the thickness direction of the vapor chamber 1), having a cavity 13 formed by stacking one plate-shaped body 11 and another plate-shaped body 12 facing the one plate-shaped body 11. The vapor chamber 1 also includes a working fluid (not illustrated) enclosed in the cavity 13. In the cavity 13, a wick structure 15 having a capillary structure is housed. Moreover, a space between an inner surface of the other plate-shaped body 12 and the wick structure 15 forms a steam flow path 18 through which a working fluid in a gas phase flows. The shape of the container 10 in a plan view is not particularly limited. However, the vapor chamber 1 is in a quadrangular shape for convenience of explanation. Moreover, the container 10 of a planar type extends along the same plane.

The one plate-shaped body 11 is in a plate shape. The other plate-shaped body 12 is in a plate shape, but a portion excluding a peripheral portion 20 of the other plate-shaped body 12 is plastically deformed in a protruding shape. The portion of the other plate-shaped body 12, protruding toward the outside and plastically deformed in a protruding shape, is a protruding part 14 of the container 10, and the inside of the protruding part 14 forms the cavity 13. The cavity 13 is a sealed space and is decompressed by deaeration treatment.

The wick structure 15 is separated from the container 10, that is, a member separated from the container 10. In the vapor chamber 1, the wick structure 15 is not joined to the container 10. The wick structure 15 extends in a planar shape along a plane of the container 10 of the planar type. In the vapor chamber 1, the wick structure 15 extends on an inner surface 21 of the one plate-shaped body 11, in surface contact with the inner surface 21, The inner surface 21 of the one plate-shaped body 11 is a smooth surface. Accordingly, the inner surface 21 of the one plate-shaped body 11 does not have a function as a wick structure. The wick structure 15 extends throughout the inner surface 21 of the one plate-shaped body 11, Moreover, a space formed between an inner surface 22 of the other plate-shaped body 12 and the wick structure 15 forms the steam flow path 18 through which a working fluid in a gas phase mainly flows.

The wick structure 15 is not particularly limited if it is a member generating capillarity. For example, a mesh member made of metal is given. Materials of a mesh member include, for example, metals such as copper, copper ahoy, aluminum, aluminum alloy, and stainless steel. Moreover, as the wick structure 15, other than a mesh member made of metal, a sintered body of metal powder such as copper or copper alloy, a sintered body of short metallic fiber such as copper or copper alloy, or the like is given. In the vapor chamber 1, as the wick structure 15, a mesh member made of metal is used.

The thickness of the wick structure 15 is selectable appropriately according to a used state of the vapor chamber 1. For example, the thickness may range from 0.1 mm to 0.2 mm. The thickness of the wick structure 15 may be adjusted. For example, it is possible to lay a piece of mesh member of a desired thickness in a planar shape. Alternatively, the thickness may be adjusted as required by laying mesh members in the thickness direction by stacking a plurality of pieces of mesh members or folding a piece of mesh member. Note that in the vapor chamber 1, a piece of mesh member is laid in a planar shape throughout the inner surface 21 of the one plate-shaped body 11.

As illustrated in FIG. 1, the inner surface 22 of the other plate-shaped body 12 is a flat surface. Further, the inner surface 22 of the other plate-shaped body 12 is a smooth surface. Accordingly, the inner surface 22 of the other plate-shaped body 12 does not have a function as a wick structure. On the inner surface 22 side of the other plate-shaped body 12 corresponding to the direction of the cavity 13, a support part 17 is provided. The support part 17 rises in a direction from the inner surface 22 of the other plate-shaped body 12 toward the inner surface 21 of the one plate-shaped body 11 when viewed from the inside of the container 10 to form a protruding part protruding in a direction from the inner surface 22 of the other plate-shaped body 12 toward the inner surface 21 of the one plate-shaped body 11. The container 10 of the vapor chamber 1 includes a plurality of support parts 17, 17, 17, . . . . In the container 10 of the vapor chamber 1, an outer surface 24 of the other plate-shaped body 12 is a flat surface. The support parts 17 are formed by providing a plurality of recessed parts 27, 27, 27, . . . on the outer surface 24 side of the other plate-shaped body 12.

The support part 17 has a function of maintaining a decompressed internal space of the container 10, that is, the cavity 13. The support part 17 extends in a direction from the inner surface 22 of the other plate-shaped body 12 toward the one plate-shaped body 11.

At a rising base portion 30 of the support part 17 from the inner surface 22 of the other plate-shaped body 12, an angle θ1 defined by the support part 17 and the inner surface 22 of the other plate-shaped body 12 is an obtuse angle, that is, larger than 90° and smaller than 180° , Further, an angle θ2 defined by an outer surface 28 of the recessed part 27 provided to the outer surface 24 of the other plate-shaped body 12 and the outer surface 24 of the other plate-shaped body 12 is an acute angle, that is, larger than 0° and smaller than 90°.

The shape of the support part 17 in a plan view, that is, the shape of the recessed part 27 in a plan view, is not limited particularly. For example, a circular shape, an elliptical shape, a quadrangular shape, and polygonal shapes such as a pentagonal shape are given. As illustrated in FIG. 2, in the vapor chamber 1, it has a circular shape. Further, as illustrated in FIG. 1, the area of the support part 17, in an extending direction of the other plate-shaped body 14, decreases as it progresses from the rising base portion 30 of the support part 17 toward a tip end portion 31 of the support part 17. Corresponding to the aspect described above, in FIG. 1, the support part 17 becomes narrower from the rising base portion 30 of the support part 17 toward the tip end portion 31 of the support part 17.

In the vapor chamber 1, the defined angle θ1 is almost uniform along the circumferential direction of the support part 17. Further, the defined angle θ2 is almost uniform along the circumferential direction of the recessed part 27.

A side face portion 32 of the support part 17 is exposed to the cavity 13. The surface of the side face portion 32 of the support part 17 is a smooth surface. The shape of the side face portion 32 of the support part 17 in a side view is not particularly limited. For example, a linear shape, a shape having a curved portion, an arc shape, and the like are given. In the vapor chamber 1, the shape of the side face portion 32 of the support part 17 in a side view is an arc shape. Accordingly, the side face portion 32 of the support part 17 exposed to the cavity 13 has a curved surface, and the entire side face portion 32 has a curved surface.

In the vapor chamber 1, at the rising base portion 30 of the support part 17 from the inner surface 22 of the other plate-shaped body 12, since the defined angle θ1 between the support part 17 and the inner surface of the other plate-shaped body 12 is an obtuse angle, it is possible to prevent a working fluid in a liquid phase from remaining in a boundary portion between the support part 17 and the inner surface 22 that is a flat portion of the other plate-shaped body 12. Accordingly, the working fluid in a liquid phase can circulate smoothly from the other plate-shaped body 12 functioning as a heat dissipation surface of the container 10 to the one plate-shaped body 11 functioning as a heat receiving surface of the container 10. Further, in the vapor chamber 1, since the defined angle θ2 between the outer surface 28 of the recessed part 27 provided to the outer surface 24 of the other plate-shaped body 12 and the outer surface 24 of the other plate-shaped body 12 is an acute angle, a gas flows to the recessed part 27 smoothly so that the condensing property of the working fluid in a gas phase is improved, whereby the heat dissipation property of the vapor chamber 1 is improved.

Further, in the vapor chamber 1, the outer surface 24 of the other plate-shaped body 12 has the recessed part 27 so that the support part 17 is formed in the container 10 to protrude from the inner surface 22 of the other plate-shaped body 12 toward the one plate-shaped body 11. Therefore, the surface area of the outer surface of the heat dissipation surface side of the container 10 is increased. Accordingly, the heat dissipation property is improved in the vapor chamber 1. Further, since the vapor chamber 1 has the support part 17, it is possible to apply the container 10 with resistance to the pressure from the external environment.

Moreover, since the area of the support part 17 in the extending direction of the other plate-shaped body 12 decreases as it progresses from the rising base portion 30 toward the tip end portion 31, the side face portion 32 of the support part 17 exposed to the cavity 13 can largely contribute to heat dissipation. Therefore, the heat dissipation property of the vapor chamber 1 is further improved.

Furthermore, since the side face portion 32 of the support part 17 exposed to the cavity 13 has a curved surface, a working fluid in a liquid phase can circulate more smoothly from the heat dissipation surface to the heat receiving surface of the container 10 through the side face portion 32 of the support part 17, that is, from the other plate-shaped body 12 to the one plate-shaped body 11.

As illustrated in FIG. 1, the tip end portion 31 of the support part 17 is a flat portion, and the flat portion of the tip end portion 31 contacts the wick structure 15. Accordingly, the support part 17 also functions as a pressing part for fixing the wick structure 15 to the inner surface 21 of the one plate-shaped body 11 by pressing the wick structure 15 toward the inner surface 21 of the one plate-shaped body 11. As described above, since the wick structure 15 is stably fixed on to the inner surface 21 of the one plate-shaped body 11, a working fluid in a liquid phase can be stably supplied to the heat receiving surface of the container 10, and dry-out can be prevented reliably. Note that in the vapor chamber 1, the tip end portion 31 of the support part 17 does not contact the inner surface 21 of the one plate-shaped body 11 of the container 10.

In the vapor chamber 1, the space between the support part 17 and the support part 17 serves as the steam flow path 18 through which a working fluid in a gas phase flows. The height of the support part 17 is selectable appropriately according to the thickness of the vapor chamber 1, the thicknesses of the one plate-shaped body 11 and the other plate-shaped body 12, and the thickness of the wick structure 15. For example, the height may range from 0.1 mm to 0.8 mm.

At the rising base portion 30 from the inner surface 22 of the other plate-shaped body 12, the defined angle θ1 between the support part 17 and the inner surface 22 of the other plate-shaped body 12 is not particularly limited if it is an obtuse angle. However, from the point of reliably improving the resistance of the container to the pressure from the external environment while preventing a working fluid in a liquid phase from remaining in the boundary portion between the support part 17 and the inner surface 22 of the other plate-shaped body 12, it is preferable that the lower limit value is 91°. From the point of reliably preventing a working fluid in a liquid phase from remaining in the boundary portion without impairing the resistance of the container to the pressure to the external environment, it is more preferable that the rawer limit value is 105°. From the point of more reliably preventing the working fluid in a liquid phase from remaining, it is particularly preferable that the lower limit value is 115°. Meanwhile, from the point of reliably preventing a working fluid in a liquid phase from remaining without impairing the resistance of the container to the pressure to the external environment, it is preferable that the upper limit value of the defined angle θ1 is 150°. From the point of reliably achieving the resistance of the container to the pressure from the external environment while reliably preventing a working fluid in a liquid phase from remaining, it is more preferable that the upper limit value is 140°. From the point of reliably improving the resistance of the container to the pressure from the external environment, it is particularly preferable that the upper limit value is 135°.

From the point of improving smoothness of the gas flow to the recessed part 27 and the resistance of the container 10 to the pressure from the external environment in a balanced manner, it is preferable that the defined angle θ2 between the outer surface 28 of the recessed part 27 provided to the outer surface 24 side of the other plate-shaped body 12 and the outer surface 24 of the other plate-shaped body 12 is 30° or larger and 89° or smaller, and it is more preferable that the defined angle θ2 is 40° or larger and 75° or smaller, and it is particularly preferable that the defined angle θ2 is 45° or larger and 65° or smaller.

In the vapor chamber 1, the ratio of the area of the rising base portion 30 of the support part 17 to the area of the tip end portion 31 of the support part 17 in the extending direction of the other plate-shaped body 12 exceeds 1.0. From the point of a balanced improvement in preventing a working fluid in a liquid phase from remaining in the boundary portion between the support part 17 and the inner surface 22 of the other plate-shaped body 12 and the resistance of the container 10 to the pressure from the external environment, it is preferable that the ratio is 1.1 or larger and 10 or smaller, it is more preferable that the ratio is 2.0 or larger and 8.0 or smaller, and it is particularly preferable that the ratio is 3.0 or larger and 6.0 or smaller.

As illustrated in FIG. 2, in the container 10, a plurality of support parts 17, 17, 17, . . . are arranged in parallel. The arrangement relationship between the support parts 17, 17, 17, . . . is not particularly limited, but in the vapor chamber 1, a given support part 17 and two other support parts 17 (17') and 17 (17') adjacent to the given support part 17 are arranged in a triangular shape. Since the plurality of support parts 17, 17, 17, . . . are arranged in a triangular shape, the resistance of the container 10 to the pressure from the external environment can be further improved. Further, the number of support parts 17 to be arranged can be reduced without impairing the resistance of the container 10 to the pressure from the external environment. Further, since the plurality of support parts 17, 17, 17, . . . are arranged in a triangular shape so that the number of the support parts 17 to be arranged can be reduced, the steam flow path 18 can be secured more reliably, and the flow property of the working fluid in a gas phase can be improved more reliably.

As a method of forming the support part 17 that is the recessed part 27 provided to the outer surface 24 side of the other plate-shaped body 12, for example, a method of providing the recessed part 27 by press-processing the other plate-shaped body 12 is given. In that case, the support part 17 is integrally formed with the other plate-shaped body 12, and the material of the support part 17 is the same as the material of the other plate-shaped body 12.

As materials of the container 10, for example, copper, aluminum, stainless steel, titanium, copper alloy, aluminum alloy, titanium alloy, and the like can be given. They may be used alone, or two or more types of them may be used together. The thickness of the vapor chamber 1 may range from 0.3 mm to 1.0 mm, for example. The thickness of the one plate-shaped body 11 and the thickness of the other plate-shaped body 12 may be the same or different. In the vapor chamber 1, the thickness of the one plate-shaped body 11 and the thickness of the other plate-shaped body 12 are the same. In the vapor chamber 1, the thickness of the one plate-shaped body 11 is almost uniform throughout the one plate-shaped body 11. Also, the thickness of the other plate-shaped body 12 is almost uniform throughout the one plate-shaped body 12. The thickness of each of the one plate-shaped body 11 and the other plate-shaped body 12 may be 0.1 mm, for example.

Further, in a state where a peripheral portion 40 of the one plate-shaped body 11 and a peripheral portion 20 of the other plate-shaped body 12 are in surface-contact with each other, the peripheral portion 20 and the peripheral portion 40 are joined together throughout the periphery, whereby the container 10 that is a sealed container is formed, and the cavity 13 is sealed. A method of joining the peripheral portion 20 and the peripheral portion 40 together is not particularly limited. For example, diffusion bonding, brazing, laser welding by a fiber laser or the like, ultrasonic welding, friction joining, press joining, and the like may be given. Among them, from the points of giving excellent sealing property to the container 10 by an improvement in the joining strength between the one plate-shaped body 11 and the other plate-shaped body 12, giving excellent mechanical strength to the container 10 by preventing a thermal load on the container 10 at the time of joining the one plate-shaped body 11 and the other plate-shaped body 12, and preventing thermal deformation of the container 10, it is preferable to use welding by the fiber laser. The joint width may range from 0.3 mm to 2.5 mm, for example.

A working fluid to be enclosed in the cavity 13 is selectable as appropriate according to the compatibility with the material of the container 10. For example, water is given. Besides it, alternative fluorocarbon, fluorocarbons, cyclopentane, ethylene glycol, mixture of any of them and water, and the like may be given.

Next, operation of the vapor chamber 1 according to the first exemplary embodiment of the present disclosure will be described with reference to FIG. 1. In the container 10, a heating element 100 is thermally connected to the outer surface 23 of the one plate-shaped body 11 whereby the one plate-shaped body 11 functions as a heat receiving surface and, out of the outer surface 23 of the one plate-shaped body 11, a portion in contact with the heating element 100 functions as a heat receiving portion. When the vapor chamber 1 receives heat from the heating element 100 at the heat receiving portion, the phase of the working fluid in a liquid phase, enclosed in the cavity 13, is changed from the liquid phase to a gas phase in the heat receiving portion, and the working fluid whose phase has been changed to the gas phase moves fro the heat receiving portion of the vapor chamber 1 mainly to the heat dissipation surface (that is, the other plate-shaped body 12) while flowing through the steam flow path 18. The working fluid in the gas phase having been moved from the heat receiving portion mainly to the heat dissipation surface dissipates the latent heat at the heat dissipation surface, and the phase is changed from the gas phase to the liquid phase. At that time, since the recessed part 27 is formed on the outer surface on the heat dissipation surface side of the container 10 so that the surface area of the outer surface on the heat dissipation surface side is increased, and since the gas flows into the recessed part 27, heat dissipation on the heat dissipation surface, that is, condensing of the working fluid in the gas phase is promoted. Further, since the side face portion 32 of the support part 17 exposed to the cavity 13 also largely contributes to heat dissipation, heat dissipation at the heat dissipation surface is promoted. The latent heat dissipated at the heat dissipation surface is further dissipated to the external environment of the vapor chamber 1. The working fluid in which the phase is changed from the gas phase to the liquid phase at the heat dissipation surface drops via the side face portion 32 of the support part 17 or from the heat dissipation surface, and circulates to the heat receiving surface (that is, the one plate-shaped body 11). The working fluid in the liquid phase, having circulated to the heat receiving surface of the container 10, is transported to the heat receiving portion by the capillarity of the wick structure 15.

Note that the vapor chamber 1 is able to be operated by natural air cooling not using a cooling air supply apparatus, without supplying cooling air (that is, forced air cooling) using a cooling air supply apparatus such as a blower fan.

Figure 3:
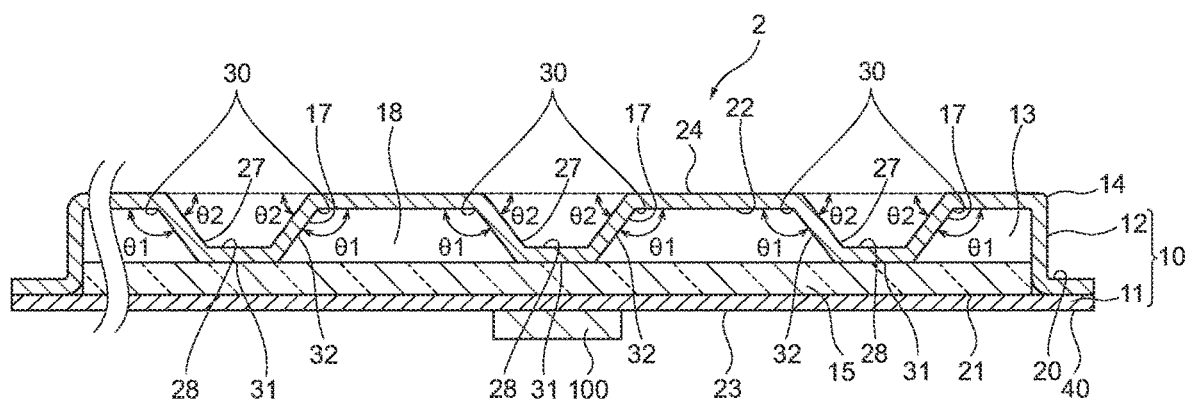
FIG. 3 is a side cross-sectional view of a vapor chamber according to a second exemplary embodiment of the present disclosure.

Next, a vapor chamber according to a second exemplary embodiment of the present disclosure will be described. Note that in the vapor chamber according to the second exemplary embodiment, the main parts are common to those of the vapor chamber according to the first exemplary embodiment. Therefore, the components that are the same as those of the vapor chamber according to the first exemplary embodiment will be described using the same reference numerals. FIG. 3 is a side cross-sectional view of a vapor chamber according to the second exemplary embodiment of the present disclosure.

In the vapor chamber 1 according to the first exemplary embodiment, the side face portion 32 of the support part 17 is in an arc shape in a side view. Instead, in a vapor chamber 2 according to the second exemplary embodiment, the side face portion 32 of the support part 17 is in a linear shape in a side view, as illustrated in FIG. 3. Further, in the vapor chamber 2, the tip end portion 31 of the support part 17 is a flat portion, and the flat portion of the tip end portion 31 contacts the wick structure 15, like the vapor chamber 1 of the first exemplary embodiment.

In the vapor chamber 2, the area of the support part 17 in the extending direction of the other plate-shaped body 14 decreases as it progresses from the rising base portion 30 of the support part 17 toward the tip end portion 31 of the support part 17. Corresponding to the aspect described above, in FIG. 3, the support part 17 becomes narrower from the rising base portion 30 of the support part 17 toward the tip end portion 31 of the support part 17, and the side cross-section of the support part 17 is in a trapezoidal shape.

In the vapor chamber 2, the shape of the support part 17 in a plan view, that is, the shape of the recessed part 27 in a plan view, is a quadrangular shape.

In the vapor chamber 2, the ratio of the area of the rising base portion 30 of the support part 17 to the area of the tip end portion 31 of the support part 17 in the extending direction of the other plate-shaped body 12 exceeds 1.0, like the vapor chamber 1 of the first exemplary embodiment. From the point of a balanced improvement in preventing a working fluid in a liquid phase from remaining at the boundary portion between the support part 17 and the inner surface 22 of the other plate-shaped body 12 and the resistance of the container 10 to the pressure from the external environment, it is preferable that the ratio between the areas is 1.1 or larger and 10 or smaller, it is more preferable that the ratio is 2.0 or larger and 8.0 or smaller, and it is particularly preferable that the ratio is 3.0 larger and 6.0 or smaller.

Even in the vapor chamber 2, like the vapor chamber 1 of the first exemplary embodiment, at the rising base portion 30 of the support part 17 from the inner surface 22 of the other plate-shaped body 12, the defined angle θ1 between the support part 17 and the inner surface of the other plate-shaped body 12 is an obtuse angle. Therefore, it is possible to prevent a working fluid in a liquid phase from remaining in the boundary portion between the support part 17 and the inner surface 22 that is a fiat portion of the other plate-shaped body 12. Accordingly, the working fluid in a liquid phase can circulate smoothly from the other plate-shaped body 12 functioning as a heat dissipation surface of the container 10 to the one plate-shaped body 11 functioning as a heat receiving surface of the container 10. Further, even in the vapor chamber 2, since the defined angle θ2 between the outer surface 28 of the recessed part 27 provided to the outer surface 24 of the other plate-shaped body 12 and the outer surface 24 of the other plate-shaped body 12 is an acute angle, the gas flows to the recessed part 27 smoothly so that the condensing property of the working fluid in the gas phase is improved, whereby the heat dissipation property of the vapor chamber 2 is improved.

Further, even in the vapor chamber 2, like the vapor chamber 1 of the first exemplary embodiment, in the container 10, the outer surface 24 of the other plate-shaped body 12 is provided with the recessed part 27 so that the support part 17 is formed to protrude from the inner surface 22 of the other plate-shaped body 12 toward the one plate-shaped body 11. Therefore, the surface area of the outer surface of the heat dissipation surface side of the container 10 is increased. Accordingly, the heat dissipation property is improved even in the vapor chamber 2. Further, since the vapor chamber 2 also has the support part 17, it is possible to apply the container 10 with resistance to the pressure from the external environment.

Figure 4:
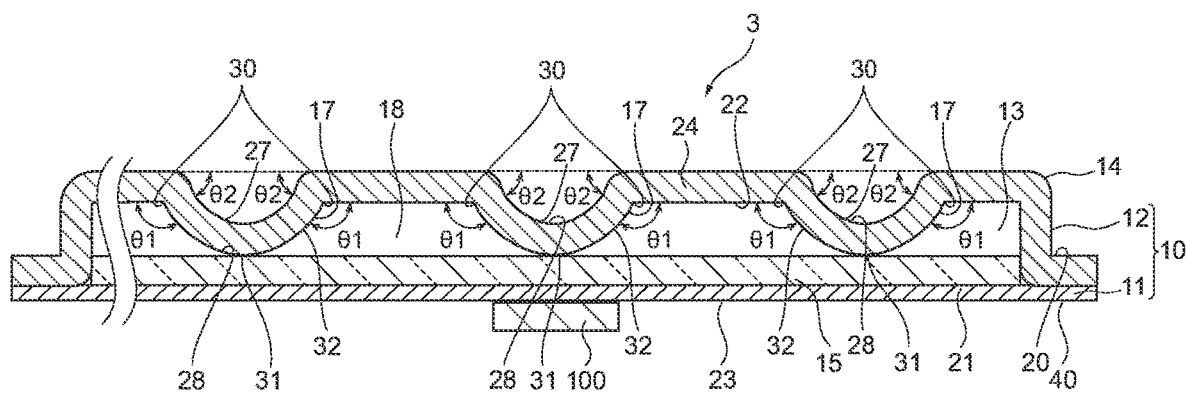
FIG. 4 is a side cross-sectional view of a vapor chamber according to a third exemplary embodiment of the present disclosure.

Next, a vapor chamber according to a third exemplary embodiment of the present disclosure will be described. In the vapor chamber according to the third exemplary embodiment, the main parts are common to those of the vapor chambers according to the first and second exemplary embodiments. Therefore, the components that are the same as those of the vapor chambers according to the first and second exemplary embodiments will be described using the same reference numerals. FIG. 4 is a side cross-sectional view of a vapor chamber according to the third exemplary embodiment of the present disclosure.

In the vapor chambers 1 and 2 according to the first and second exemplary embodiments, the thickness of the one plate-shaped body 11 and the thickness of the other plate-shaped body 12 are the same. Instead, in the vapor chamber 3 of the third exemplary embodiment, the thickness of the other plate-shaped body 12 is larger than the thickness of the one plate-shaped body 11, as illustrated in FIG. 4, The thickness of the one plate-shaped body 11 is almost uniform throughout the one plate-shaped body 11. Also, the thickness of the other plate-shaped body 12 is almost uniform throughout the other plate-shaped body 12. Even in the vapor chamber 3, like the vapor chambers 1 and 2, in the container 10, the outer surface 24 of the other plate-shaped body 12 is provided with the recessed part 27 so that the support part 17 is formed to protrude from the inner surface 22 of the other plate-shaped body 12 toward the one plate-shaped body 11.

The thickness of the one plate-shaped body 11 is not particularly limited, but it may be 0.08 mm, for example. The thickness of the other plate-shaped body 12 is not particularly limited, but it may be 0.12 mm, for example. The thickness of the vapor chamber 3 may range from 0.3 mm to 1.0 mm, for example. Note that even in the vapor chamber 3, the heating element 100 is thermally connected to the one plate-shaped body 11.

Since the vapor chamber 3 has the support part 17 formed by providing the recessed part 27 to the outer surface 24 of the other plate-shaped body 12, resistance to the pressure from the external environment can be applied to the container 10. Further, since the other plate-shaped body 12 having the support part 17 has a larger thickness, the resistance of the container 10 to the pressure from the external environment is further improved, and more excellent mechanical strength is applied to the container 10. Accordingly, even if a load is placed on the container 10 depending on the conditions of installation and usage of the vapor chamber 3, it is possible to prevent warpage from being caused in the container 10 more reliably.

Figure 5:
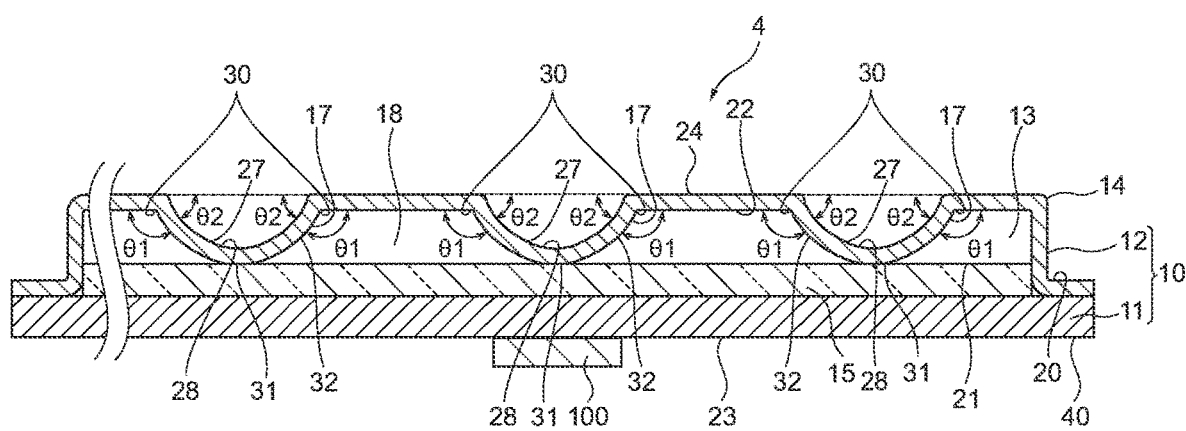
FIG. 5 is a side cross-sectional view of a vapor chamber according to a fourth exemplary embodiment of the present disclosure.

Next, a vapor chamber according to a fourth exemplary embodiment of the present disclosure will be described. In the vapor chamber according to the fourth exemplary embodiment, the main parts are common to those of the vapor chambers according to the first to third exemplary embodiments. Therefore, the components that are the same as those of the vapor chambers according to the first to third exemplary embodiments will be described using the same reference numerals. FIG. 5 is a side cross-sectional view of the vapor chamber according to the fourth exemplary embodiment of the present disclosure.

In the vapor chambers 1 and 2 according to the first and second exemplary embodiments, the thickness of the one plate-shaped body 11 and the thickness of the other plate-shaped body 12 are the same. Instead, in a vapor chamber 4 of the fourth exemplary embodiment, the thickness of the one plate-shaped body 11 is larger than the thickness of the other plate-shaped body 12, as illustrated in FIG. 5. The thickness of the one plate-shaped body 11 is almost uniform throughout the one plate-shaped body 11. Also, the thickness of the other plate-shaped body 12 is almost uniform throughout the one plate-shaped body 12. Even in the vapor chamber 4, like the vapor chambers 1 and 2, in the container 10, the outer surface 24 of the other plate-shaped body 12 is provided with the recessed part 27 so that the support part 17 is formed to protrude from the inner surface 22 of the other plate-shaped body 12 toward the one plate-shaped body 11.

The thickness of the one plate-shaped body 11 is not particularly limited, but it may be 0.12 mm, for example. The thickness of the other plate-shaped body 12 is not particularly limited, but it may be 0.08 mm, for example. The thickness of the vapor chamber 4 may range from 0.3 mm to 1.0 mm, for example. Note that even in the vapor chamber 4, the heating element 100 is thermally connected to the one plate-shaped body 11.

Since the vapor chamber 4 has the support part 17 formed by providing the recessed part 27 to the outer surface 24 of the other plate-shaped body 12, resistance to the pressure from the external environment can be applied to the container 10. Further, since the one plate-shaped body 11 has a larger thickness, the mechanical strength of the one plate-shaped body 11 is improved, so that deformation of the one plate-shaped body 11 such as bending and warp can be prevented. Accordingly, in the vapor chamber 4, the contact property between the heating element 100 and the container 10 is improved, so that the container 10 is provided with excellent thermal connectivity to the heating element 100, while having resistance to the pressure from the external environment.

Figure 6:
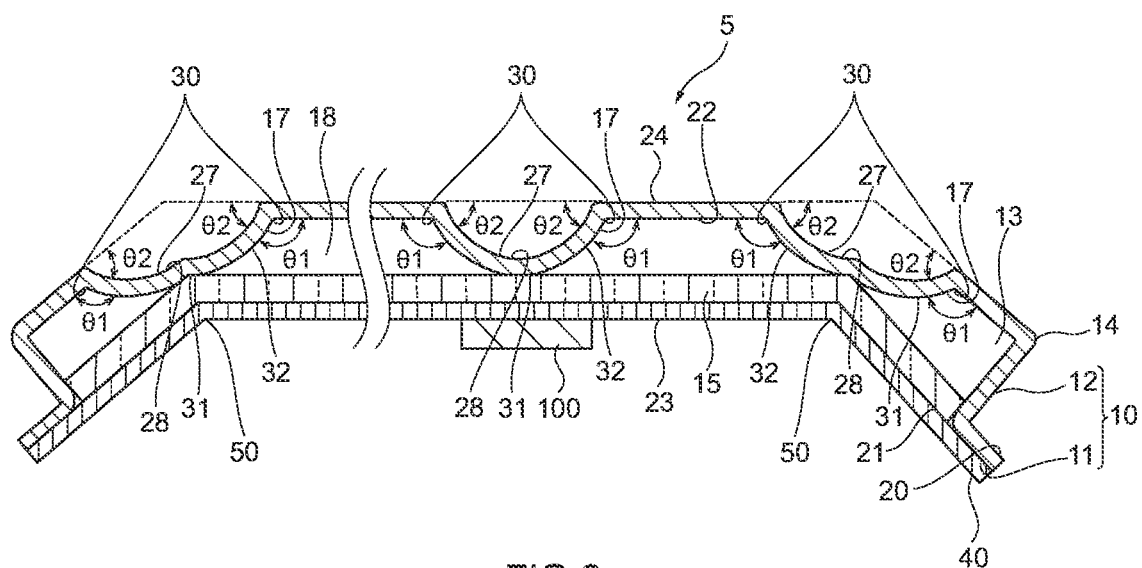
FIG. 6 is a side cross-sectional view of a vapor chamber according to a fifth exemplary embodiment of the present disclosure.

Next, a vapor chamber according to a fifth exemplary embodiment of the present disclosure will be described. In the vapor chamber according to the fifth exemplary embodiment, the main parts are common to those of the vapor chambers according to the first to fourth exemplary embodiments. Therefore, the components that are the same as those of the vapor chambers according to the first to fourth exemplary embodiments will be described using the same reference numerals. FIG. 6 as a side cross-sectional view of the vapor chamber according to the fifth exemplary embodiment of the present disclosure.

In the vapor chambers 1, 2, 3, and 4 according to the first to fourth exemplary embodiments, the container 10 of a planar type extends on the same plane. Instead, in a vapor chamber 5 of the fifth exemplary embodiment, the container 10 of a planar type does not extend on the same plane, and has a bent portion 50, as illustrated in FIG. 6. The bent portion 50 of the container 10 is a portion that is bent in the thickness direction of the container 10.

In the vapor chamber of the present disclosure having the support part 17 formed by providing the recessed part 27 to the outer surface 24 of the other plate-shaped body 12, like the vapor chamber 5, the bent portion 50 may be formed in the thickness direction of the container 10 according to the used conditions or the like. That is, the vapor chamber 5 is mountable on an apparatus having a bent portion. In the vapor chamber 5, although the bent portion 50 is provided to the container 10, buckling of the container 10 that may be caused by the bent portion 50 can be prevented because it has the support part 17. Therefore, the cavity 13 can be maintained even in the bent portion 50. As a result, the cavity 13 can be maintained throughout the container 10 having the bent portion 50.

The method of forming the bent portion 50 is not particularly limited. A method of forming the bent portion 50 by mounting the container 10 on a mold, a method of forming the bent portion 50 by performing bender work on the container 10, and the like may be given.

Next, another exemplary embodiment of a vapor chamber of the present disclosure will be described. In the vapor chamber of each of the exemplary embodiments provided above, as the wick structure 15, a piece of mesh member is laid in a planar shape throughout the inner surface 21 of the one plate-shaped body 11. Instead, in the heat receiving portion of the one plate-shaped body 11 to which the heating element 100 is thermally connected, an aspect that a plurality of pieces of mesh members are stacked to be layered as the wick structure 15 is acceptable, In that case, in the portion other than the heat receiving portion, the wick structure 15 may be a piece of mesh member. That is, an aspect that the thickness of the wick structure 15 in the heat receiving portion is larger than the thickness of the wick structure 15 in the portion other than the heat receiving portion is acceptable. In the heat receiving portion of the one plate-shaped body 11, since a plurality of mesh members are stacked, the capillarity of the wick structure 15 and the amount of holding the working fluid in a liquid phase in the heat receiving portion are further improved, whereby dry-out in the heat receiving portion can be prevented reliably.

On the inner surface of the container 10 of the vapor chamber according to each of the exemplary embodiments, an oxide film may be further formed. As composition of an oxide film, for example, metal oxide used in the container 10 may be given. Further, as structures of an oxide film, a crystal substance and an amorphous substance may be given. Since an oxide film is formed on the inner surface of the container 10, corrosion of the inner surface of the container 10 can be prevented, so that the durability of the container 10 is improved.

In the vapor chamber according to each of the exemplary embodiments, the surface of the side face portion 32 of the support part 17 is a smooth surface. Instead, a structure in which the surface of the side face portion 32 has capillarity may be accepted. When the surface of the side face portion 32 has capillarity, a working fluid in a liquid phase can circulate from the heat dissipation surface of the container 10 to the heat receiving surface more smoothly. As structures having capillarity, for example, a sintered body layer of metal power formed on the surface of the side face portion 32, a plurality of narrow grooves formed on the surface of the side face portion 32, and the like may be given.

In the vapor chamber according to each of the exemplary embodiments, the wick structure 15 is not joined to the one plate-shaped body 11 of the container 10. instead, the wick structure 15 may be joined to the one plate-shaped body 11 of the container 10, As an aspect in which the wick structure 15 is joined to the one plate-shaped body 11 of the container 10, for example, an aspect in which the wick structure 15 is a sintered body of metal powder or a sintered body of short metal fiber, and the sintered body of metal powder or the sintered body of short metal fiber is provided on the inner surface 21 of the one plate-shaped body 11, is given. In this aspect, a working fluid in a liquid phase can receive heat from the heat receiving portion more reliably.

In the vapor chamber of each of the exemplary embodiments, the Up end portion 31 of the support part 17 contacts the wick structure 15. Instead, the Up end portion 31 of the support part 17 may contact the inner surface 21 of the one plate-shaped body 11 of the container 10. In that case, around the Up end portion 31 of the support part 17 on the inner surface 21 of the one plate-shaped body 11, the wick structure 15 such as a sintered body of metal powder or a sintered body of short metal fiber is provided. Since the Up end portion 31 of the support part 17 contacts the inner surface 21 of the one plate-shaped body 11 of the container 10, the resistance of the container 10 to the pressure from the external environment is further improved.

In the vapor chamber of each of the exemplary embodiments, the Up end portion 31 of the support part 17 contacts the wick structure 15. Instead, among a plurality of support parts 17, 17, 17, . . . , the Up end portions 31 of some of the support parts 17 may contact the wick structure 15 and the Up end portions 31 of the remaining support parts 17 may contact the inner surface 21 of the one plate-shaped body 11 of the container 10. In that case, for example, in the heat receiving portion of the one plate-shaped body 11, the tip end portion 31 of the support part 17 may contact the wick structure 15, and in the area other than the heat receiving portion of the one plate-shaped body 11, the Up end portion 31 of the support part 17 may contact the inner surface 21 of the one plate-shaped body 11. In the aspect described above, a working fluid in a liquid phase receives the heat from the heat receiving portion more reliably, and the resistance of the container 10 to the pressure from the external environment is further improved.

The vapor chamber of the present disclosure is excellent in resistance to the pressure from the external environment and the heat dissipation property, and allows the flow property of the working fluid to be smoothed. Therefore, the vapor chamber is applicable to a wide range of fields. For example, the vapor chamber has a high use value in the field of cooling electric devices with high functionality such as a mobile information terminal and a personal computer such as a 2-in-1 tablet.

What is claimed is:

1. A vapor chamber comprising:
    a container having a cavity, the cavity being formed of one plate-shaped body to which a heating element is thermally connected and an other plate-shaped body facing the one plate-shaped body;
    a working fluid enclosed in the cavity; and
    a wick structure housed in the cavity, the wick structure being separated from the container, wherein
    the container includes a support part protruding from an inner surface of the other plate-shaped body toward the one plate-shaped body, the support part being formed of a recessed part provided to an outer surface of the other plate-shaped body,
    at arising base portion of the recessed part from the inner surface of the other plate-shaped body, a defined angle between the recessed part and the inner surface of the other plate-shaped body is 91° or larger and 150° or smaller, and a defined angle between an outer surface of the recessed part provided to the outer surface side of the other plate-shaped body and the outer surface of the other plate-shaped body is 45° or larger and 65° or smaller,
    the recessed part becomes narrower in a side view as the recessed part progresses from the rising base portion toward a tip end portion protruding toward the one plate-shaped body,
    a ratio of an area of the rising base portion of the recessed part in an extending direction of the other plate-shaped body to an area of the tip end portion of the recessed part in the extending direction of the other plate-shaped body is 3.0 or larger and 6.0 or smaller, and a shape of the support part in a plan view is a circular shape or an elliptical shape, and a shape of a side face portion of the support part in a side view is an arc shape.

2. The vapor chamber according to claim 1, wherein a side face portion of the support part, exposed to the cavity, has a curved surface.

3. The vapor chamber according to claim 1, wherein a tip end portion of the support part has a flat portion, and the flat portion contacts the wick structure.

4. The vapor chamber according to claim 2, wherein a tip end portion of the support part has a flat portion, and the flat portion contacts the wick structure.

5. The vapor chamber according to claim 1, wherein a plurality of the support parts are provided to the other plate-shaped body, and a given one of the support parts and two others of the support parts adjacent to the given one are arranged in a triangular shape.

6. The vapor chamber according to claim 2, wherein a plurality of the support parts are provided to the other plate-shaped body, and a given one of the support parts and two others of the support parts adjacent to the given one are arranged in a triangular shape.

7. The vapor chamber according to claim 3, wherein a plurality of the support parts are provided to the other plate-shaped body, and a given one of the support parts and two others of the support parts adjacent to the given one are arranged in a triangular shape.

8. The vapor chamber according to claim 4, wherein a plurality of the support parts are provided to the other plate-shaped body, and a given one of the support parts and two others of the support parts adjacent to the given one are arranged in a triangular shape.

9. The vapor chamber according to claim 1, wherein the wick structure is a mesh member made of metal.

10. The vapor chamber according to claim 1, wherein a peripheral portion of the one plate-shaped body and a peripheral portion of the other plate-shaped body are joined together by welding using a fiber laser to form the container.

11. The vapor chamber according to claim 1, wherein thickness of the one plate-shaped body is larger than thickness of the other plate-shaped body.

12. The vapor chamber according to claim 1, wherein thickness of the one plate-shaped body is smaller than thickness of the other plate-shaped body.

13. The vapor chamber according to claim 1, wherein the container includes a bent portion in a thickness direction of the container.

* * * * *